(12) United States Patent
Liu

(10) Patent No.: US 8,120,918 B2
(45) Date of Patent: Feb. 21, 2012

(54) HEAT DISSIPATION DEVICE

(75) Inventor: Jian Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 48 days.

(21) Appl. No.: 12/873,209

(22) Filed: Aug. 31, 2010

(65) Prior Publication Data

US 2011/0110040 A1 May 12, 2011

(30) Foreign Application Priority Data

Nov. 12, 2009 (CN) .......................... 2009 1 0309642

(51) Int. Cl.
*H05K 7/20* (2006.01)
*F28D 15/00* (2006.01)
*F28F 7/00* (2006.01)
*H01L 23/34* (2006.01)

(52) U.S. Cl. ................... 361/700; 165/104.33; 165/185; 361/697; 361/719; 257/719

(58) Field of Classification Search .................. 361/697, 361/700

See application file for complete search history.

(56) References Cited

U.S. PATENT DOCUMENTS

| 6,497,273 | B1 * | 12/2002 | Horng et al. | 165/80.3 |
| 7,057,897 | B2 * | 6/2006 | Leu | 361/704 |
| 7,116,556 | B2 * | 10/2006 | Lee et al. | 361/704 |
| 7,126,823 | B2 * | 10/2006 | Chen et al. | 361/702 |
| 7,164,583 | B2 * | 1/2007 | Lee et al. | 361/704 |
| 7,180,743 | B2 * | 2/2007 | Chen et al. | 361/704 |
| 7,333,340 | B2 * | 2/2008 | Zhang et al. | 361/719 |
| 7,474,532 | B1 * | 1/2009 | Desrosiers et al. | 361/719 |
| 7,870,888 | B2 * | 1/2011 | Zhou et al. | 165/80.3 |
| 2008/0251237 | A1 * | 10/2008 | Hung | 165/80.3 |
| 2011/0146954 | A1 * | 6/2011 | Liu | 165/104.26 |
| 2011/0149516 | A1 * | 6/2011 | Yang | 361/697 |
| 2011/0261532 | A1 * | 10/2011 | Yang | 361/697 |

* cited by examiner

*Primary Examiner* — Gregory Thompson
(74) *Attorney, Agent, or Firm* — Altis Law Group, Inc.

(57) ABSTRACT

An exemplary heat dissipation device includes a fan having a plurality of first fixing cylinders, a heat sink having a plurality of second fixing cylinders, and a plurality of fasteners fixing the fan to the heat sink. Each of the fasteners includes a screwing post, an elastic member encircling the screwing post, and an annular fastening collar engaging with the screwing post. Each of the fasteners extends through a corresponding first fixing cylinder of the fan and a corresponding second fixing cylinder of the heat sink. The elastic member of each fastener is compressed between the corresponding first fixing cylinder and the corresponding second fixing cylinder.

20 Claims, 6 Drawing Sheets

HEAT DISSIPATION DEVICE

BACKGROUND

1. Technical Field

The disclosure relates to heat dissipation devices, and, more particularly, to a heat dissipation device for dissipating heat generated by an electronic component.

2. Description of Related Art

It is well known that, during operation of a computer, electronic components such as central processing units (CPUs) frequently generate large amounts of heat. The heat must be quickly removed from the electronic component to prevent it from becoming unstable or being damaged. In many or most computers, a heat dissipation device is utilized to dissipate the heat from the electronic component.

A typical heat dissipation device includes a heat sink, and a plurality of fasteners for keeping the heat sink in contact with the electronic component. The heat sink includes a base and a fin unit arranged on the base. The base includes a rectangular body, and four ears extending outwards from four corners of the body. Each of the fasteners includes a head, a shaft extending coaxially downwardly from the head, and a threaded pole extending coaxially downwardly from the shaft. In the process of mounting each fastener on the heat sink, a spring is provided to encircle the shaft of the fastener, and then the fastener with the spring extends through the ear of the base along a top to bottom direction of the base. When the heat sink is fixed to a printed circuit board where the electronic component is mounted, the threaded pole of the fastener is extended beyond a bottom face of the base to engage with the printed circuit board, and the spring is compressed between the head and the base, whereby a reacting force is exerted on the base by the compressed spring, to make the base attach to the electronic component tightly.

However, the heat dissipation device usually further includes a fan mounted on the heat sink and a plurality of screws fixing the fan on the heat sink. This makes the operation of assembly of the heat dissipation device more complex, troublesome and costly.

What is needed, therefore, is a heat dissipation device which overcomes the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
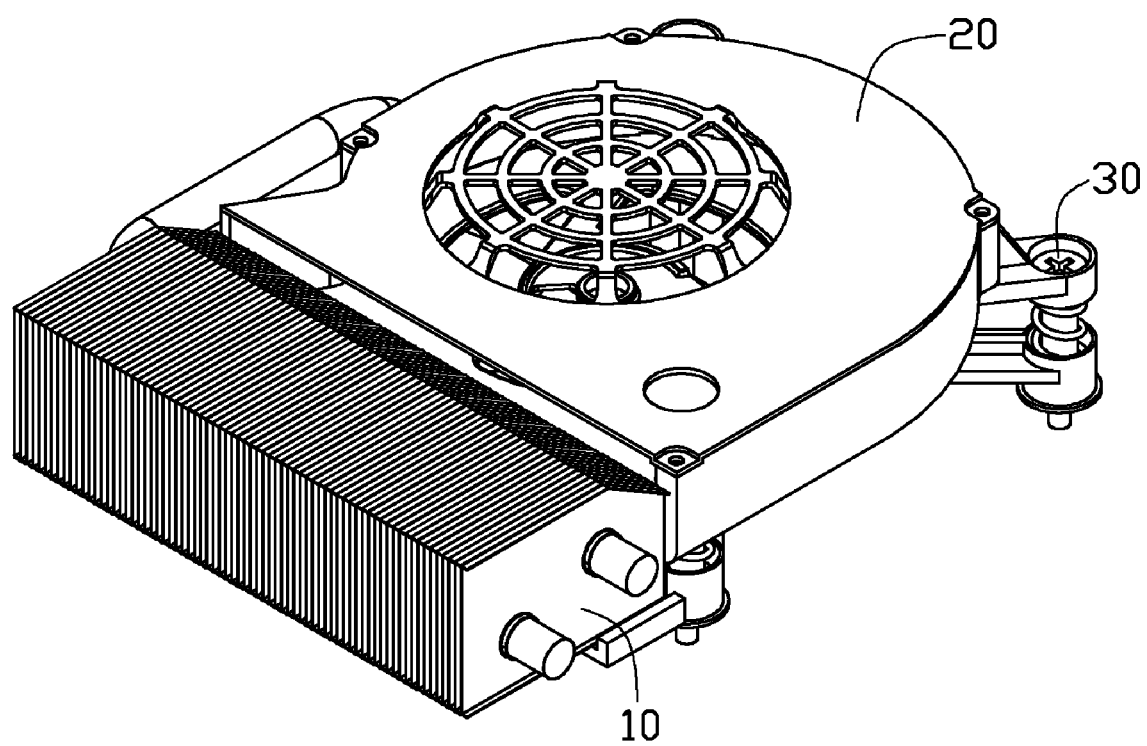
FIG. 1 is an isometric, assembled view of a heat dissipation device in accordance with an embodiment of the disclosure.
Figure 2:
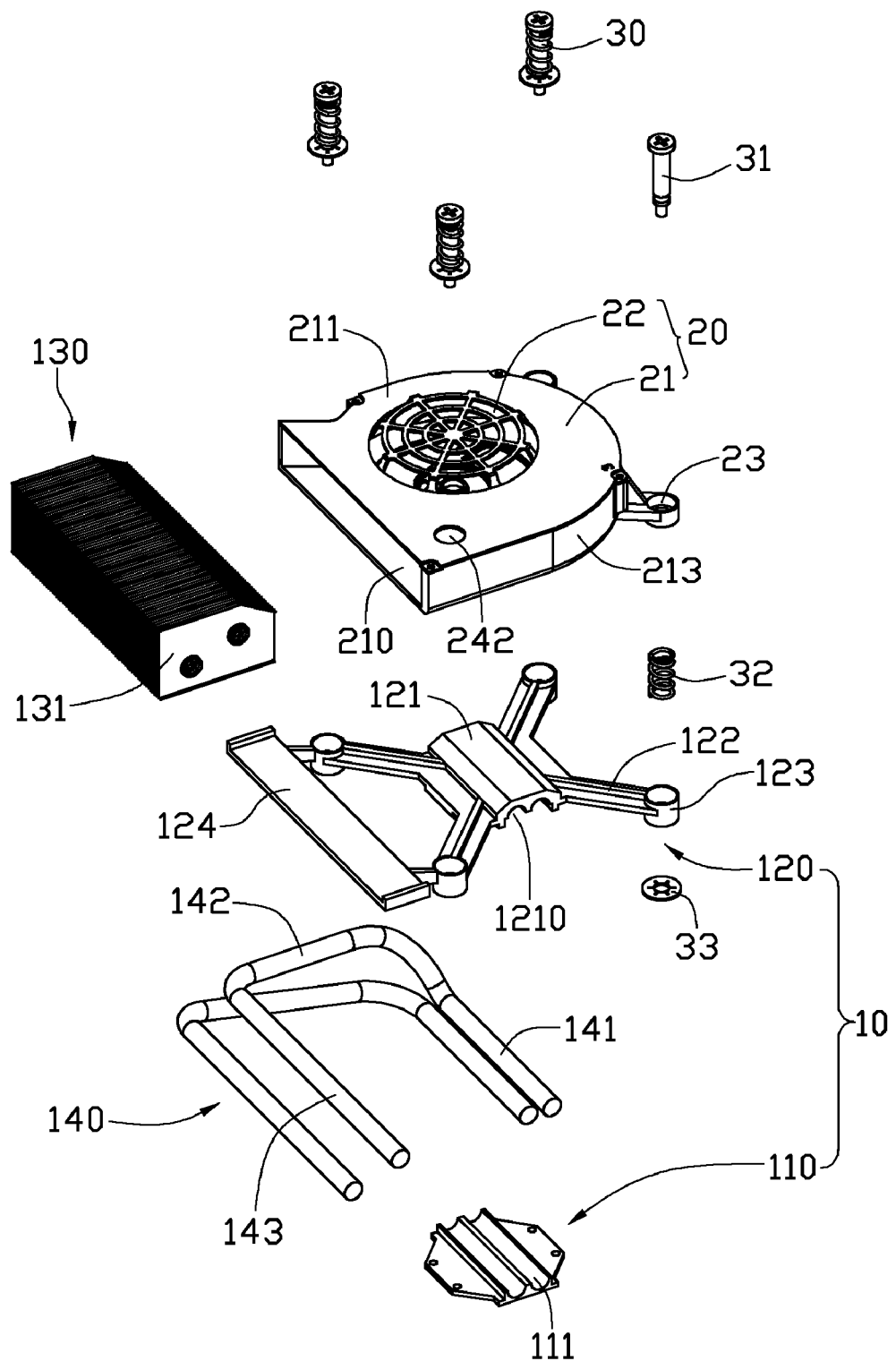
FIG. 2 is an exploded view of FIG. 1.
Figure 6:
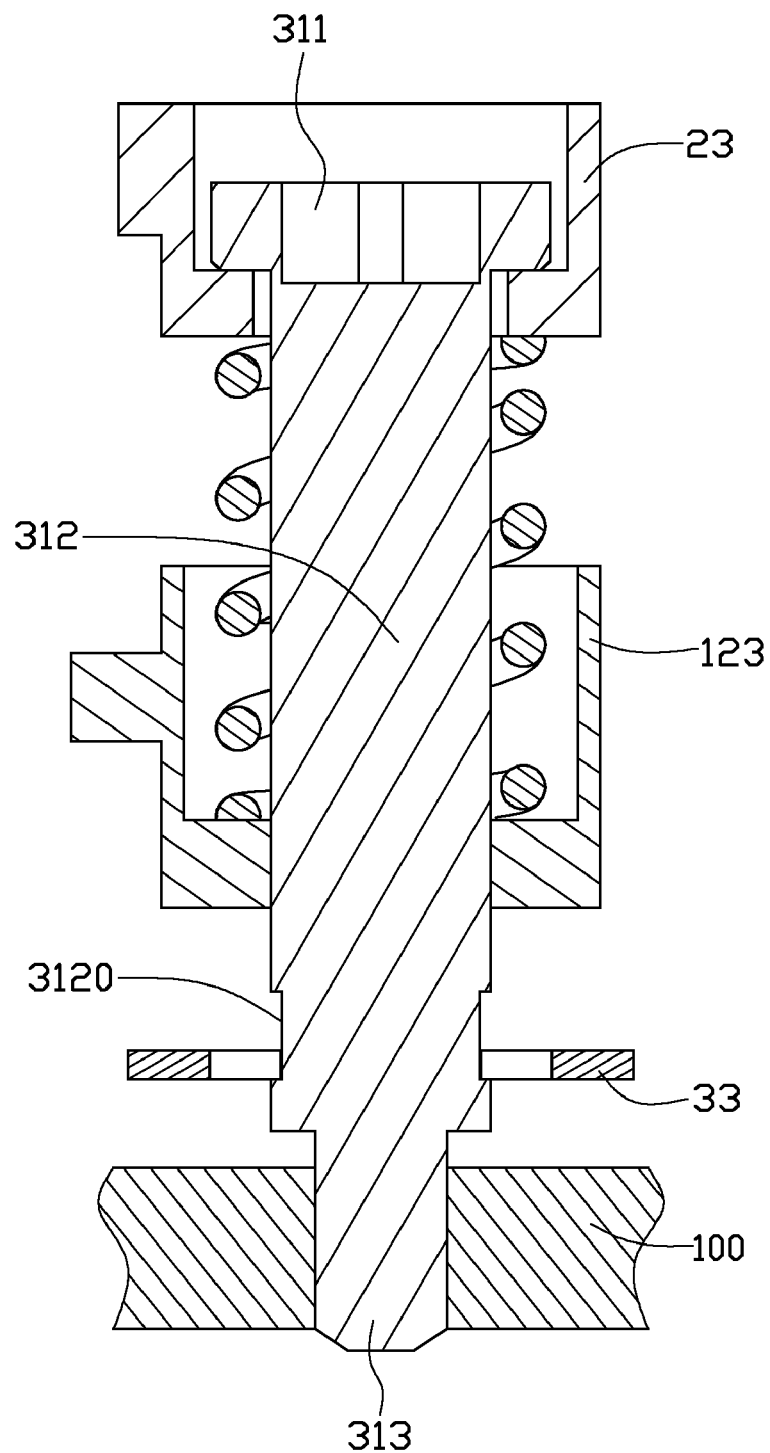
FIG. 6 is similar to FIG. 5, but also shows a printed circuit board to which the fastener is attached.

Referring to FIGS. 1 and 2, a heat dissipation device in accordance with an embodiment of the disclosure is used for dissipating heat generated by an electronic component (not shown) mounted on a printed circuit board 100 (see FIG. 6). The heat dissipation device comprises a heat sink 10, a fan 20, and a plurality of fixing members 30 fixing the fan 20 to the heat sink 10. In the embodiment of the present disclosure, there are four fixing members 30.

Figure 3:
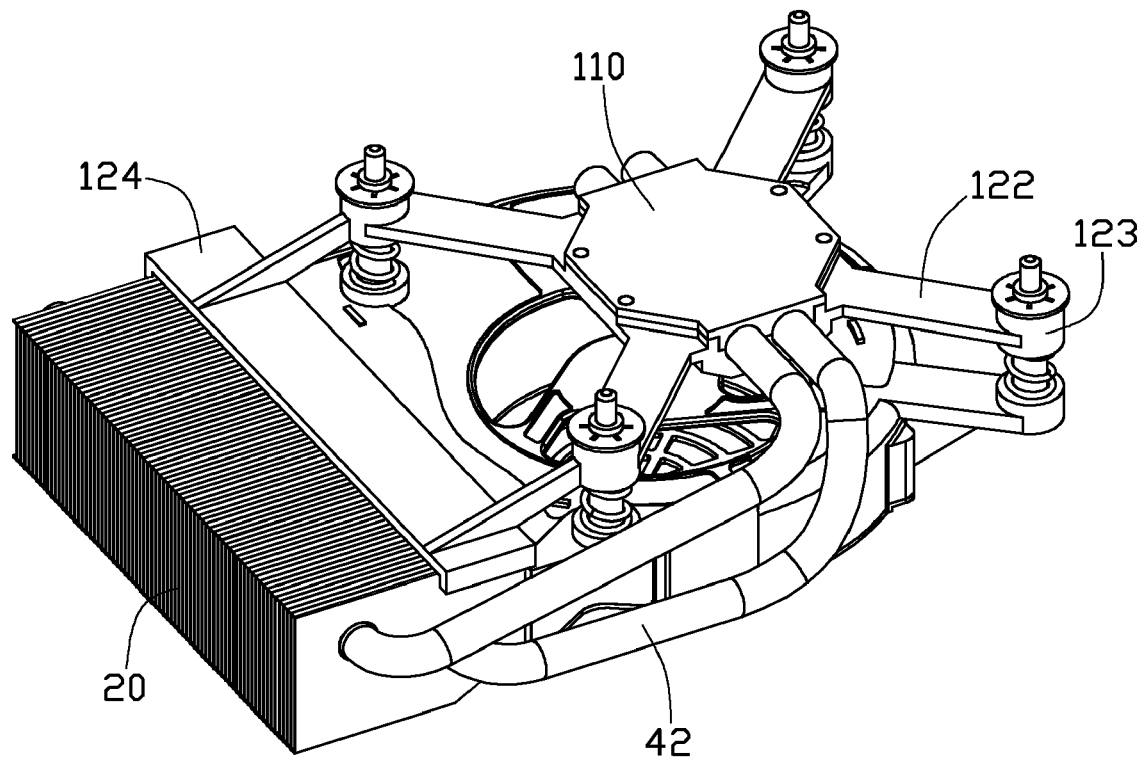
FIG. 3 is a view of the heat dissipation device of FIG. 1, but showing the heat dissipation device inverted.
Figure 4:
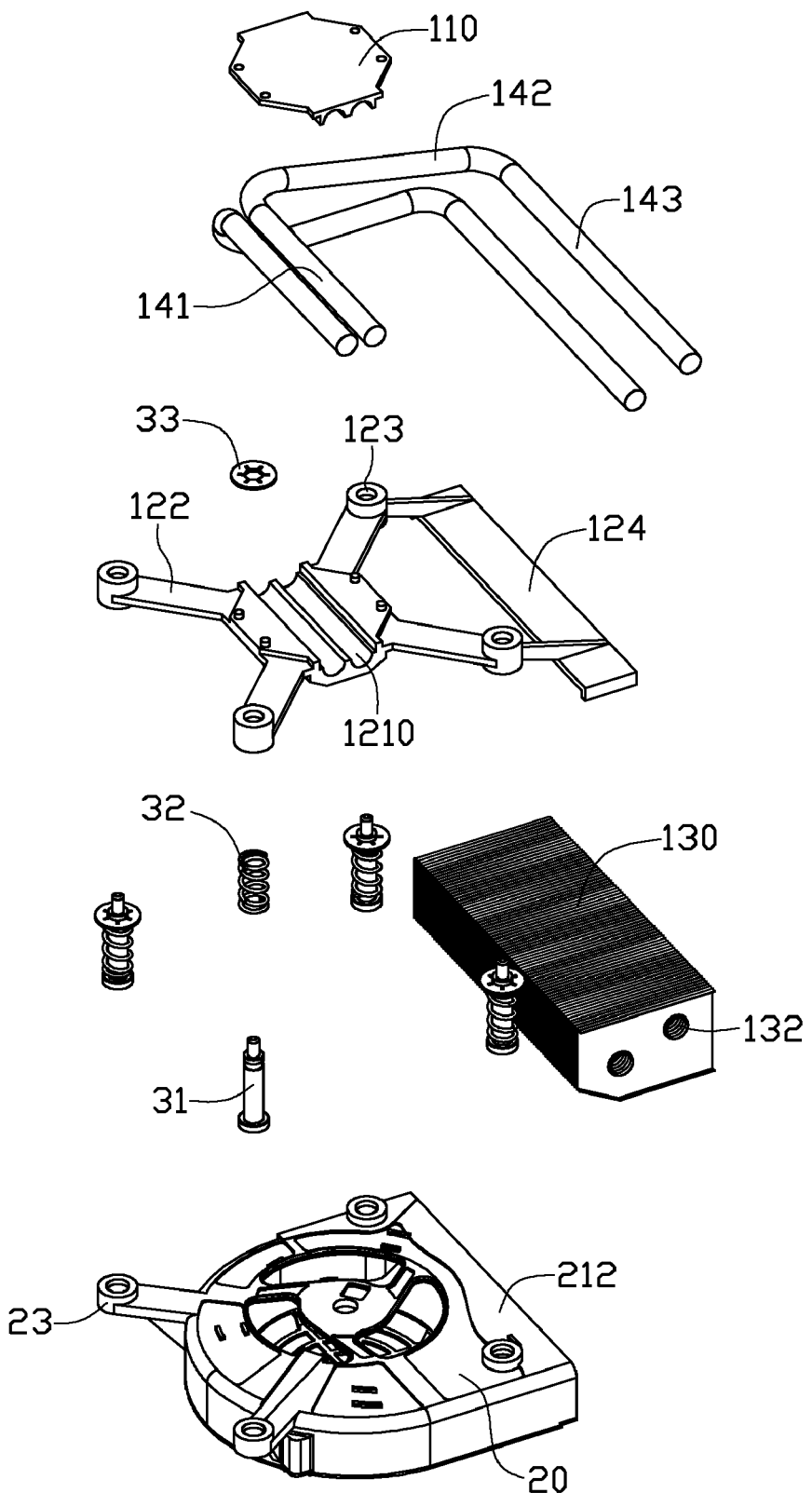
FIG. 4 is a view of the heat dissipation device of FIG. 2, but showing the heat dissipation device inverted.

Referring to FIGS. 3 and 4 also, the heat sink 10 comprises a base 110, a supporting board 120 engaged with the base 110, a fin set 130 disposed on the supporting board 120, and a plurality of heat pipes 140 thermally connecting the base 110, the supporting board 120 and the fin set 130. In the embodiment of the present disclosure, there are two heat pipes 140. Each of the heat pipes 140 comprises an evaporation section 141, a condensation section 143, and a connecting section 142 interconnecting the evaporation section 141 and the condensation section 143.

The base 110 has a bottom face attached on the electronic component. Two parallel first grooves 111 are defined in a top face of the base 110. The evaporation sections 141 of the two heat pipes 140 are received in the two first grooves 111, respectively. The supporting board 120 comprises a substantially rectangular main body 121, four mounting feet 122 extending radially and outwardly from four corners of the main body 121, and four first fixing cylinders 123 extending from distal ends of the four mounting feet 122, respectively. Two parallel second grooves 1210 are defined in a bottom face of the main body 121. The two second grooves 1210 are located corresponding to the two first grooves 111 of the base 110. The two first grooves 111 cooperate with the two second grooves 1210 to accommodate the evaporation sections 141 of the heat pipes 140, respectively. In other words, the evaporation sections 141 of the heat pipes 140 are sandwiched between the base 110 and the supporting board 120.

The heat sink 10 further comprises a fin set holder 124 extending outwardly from two first fixing cylinders 123 of the supporting board 120. The fin set 130 is secured to a lateral side of the supporting board 120 via the fin set holder 124. The fin set holder 124 comprises a flat supporting portion (not labeled) supporting the fin set 130, and two arms (not labeled) interconnecting the supporting portion and the two first fixing cylinders 123 of the supporting board 120, respectively.

The fin set 130 comprises a plurality of fins 131. Each fin 131 comprises an upright sheet body (not labeled), and a pair of flanges (not labeled) bent horizontally from a top and a bottom of the sheet body and engaging with the sheet body of an adjacent fin 131. A passage (not labeled) is formed between every two adjacent fins 131, for allowing airflow through the fin set 130. Two spaced elongated receiving holes 132 are defined in the fin set 130, for accommodating the condensation sections 143 of the heat pipes 140. Each of the receiving holes 132 extends transversely (perpendicularly) through the fins 131 of the fin set 130.

The fan 20 comprises a housing 21 disposed on the supporting board 120, and an impeller 22 rotatably disposed in the housing 21. The housing 21 comprises a top plate 211, a bottom plate 212 located opposite to the top plate 211 and a volute sidewall 213 extending upwardly from an outer periphery of the bottom plate 212 and fixed to the top plate 211. Each of the top plate 211 and the bottom plate 212 defines a plurality of through holes at a center thereof, each plurality of through holes functioning as an air inlet for the fan 20. The top plate 211, the bottom plate 212, and the sidewall 213 cooperatively define a receiving space for receiving the impeller 22 therein. The sidewall 211 defines a rectangular air outlet 210 at a left lateral side of the housing 21. The fin set 130 is located adjacent to the air outlet 210 of the housing 21, and the passages of the fin set 130 directly communicate with the air outlet 210. The fan 20 further comprises four second fixing cylinders 23 extending outwardly from the bottom plate 212 of the housing 21, wherein three second fixing cylinders 23 are located outside the housing 21, and the other second fixing cylinder 23 is located inside the housing 21. An engaging hole 242 is defined in the top plate 211, corresponding to the other second fixing cylinder 23. The four second fixing cylinders 23 are located corresponding to the four first fixing cylinders 123, respectively. In assembly, each of the fasteners 30 is extended through a corresponding first fixing cylinder 123 and a corresponding second fixing cylinder 23, and screwed into the printed circuit board 100. The fan 20 is located over and spaced from the supporting board 120 of the heat sink 10.

Figure 5:
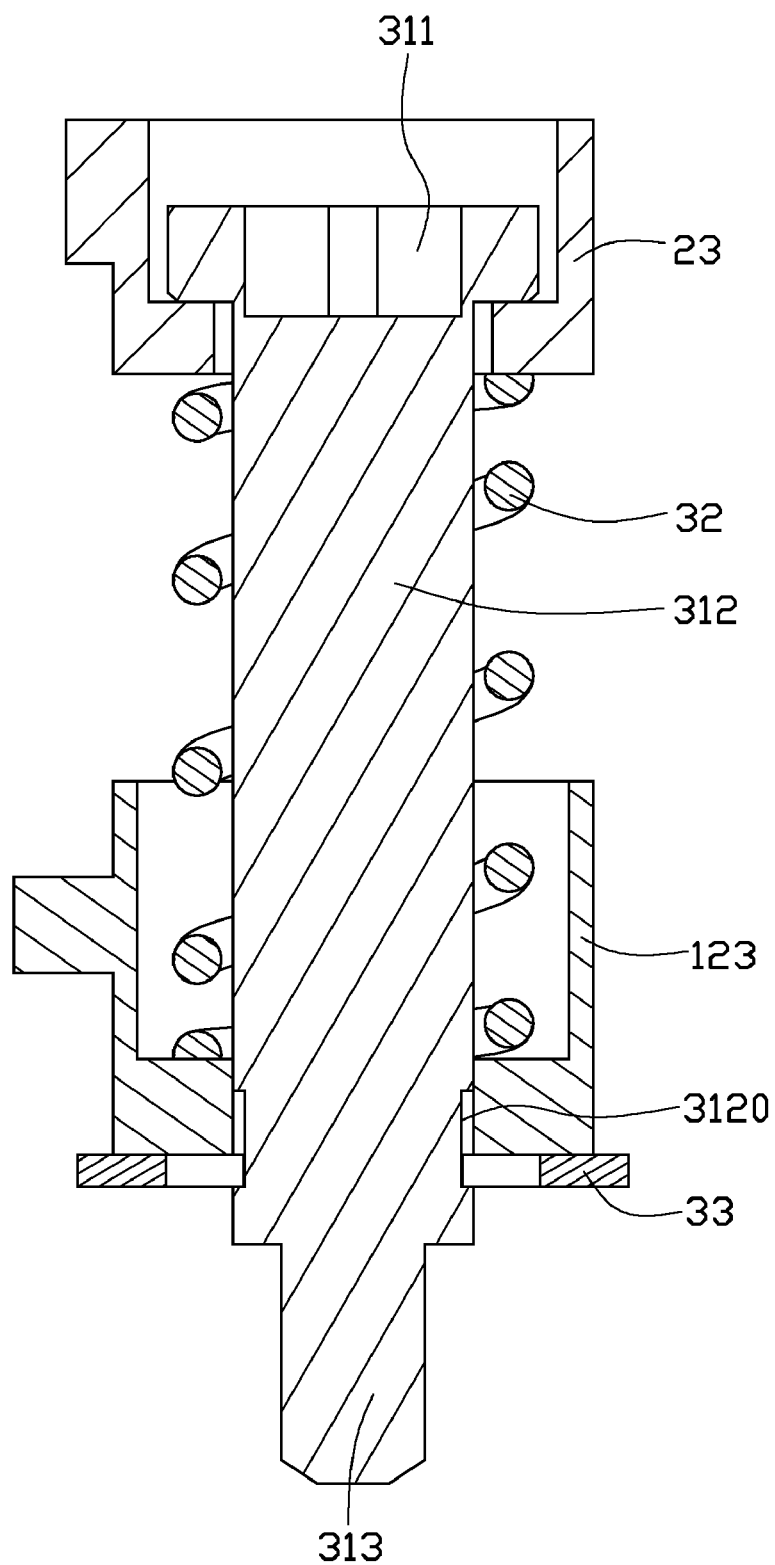
FIG. 5 is an enlarged, cross-section view of part of the heat dissipation device of FIG. 1, showing a fastener of the heat dissipation device assembled with a first fixing cylinder of a fan of the heat dissipation device and a second fixing cylinder of a heat sink of the heat dissipation device.

Referring to FIGS. 5 and 6 also, each of the fasteners 30 comprises a screwing post 31, an elastic member 32 such as a helical spring encircling the screwing post 31, and an annular fastening collar 33 engaging with the screwing post 31. The screwing post 31 comprises a head 311, a shaft 312 extending coaxially downwardly from the head 311, and a threaded pole 313 extending coaxially downwardly from the shaft 312. A cruciform groove (not labeled) is defined in a top face of the head 311, adapted for facilitating a tool to operate the fastener 30. The shaft 312 has a cylindrical configuration. A diameter of the shaft 312 is smaller than that of the head 311, and larger than that of the threaded pole 313. The shaft 312 defines an annular groove 3120 in a circumference thereof adjacent to the threaded pole 313. The fastening collar 33 is received in the annular groove 3120 and encircles the shaft 312. In this embodiment, the fastening collar 33 comprises a plurality of elastically deformable protrusions, which are equally angularly spaced from each other around an inner periphery of the fastening collar 33, and which extend radially inward towards a center of the fastening collar 33. Inmost edges of the protrusions are arranged along a circle, and define an internal diameter of the fastening collar 33. The internal diameter of the fastening collar 33 is smaller than a diameter of the shaft 312.

Referring to FIGS. 1-5 again, in assembly of the heat dissipation device, for each fastener 30, the screwing post 31 firstly extends through the corresponding first fixing cylinder 123 along a top to bottom direction. Then the elastic member 32 encircles the shaft 332 of the screwing post 31, and the screwing post 31 with the elastic member 32 extends through the corresponding second fixing cylinder 23 along the top to bottom direction. At the same time, a downward pressure is exerted on the fastener 30 by, e.g., a human operator, to make the annular groove 3120 extend beyond a bottom surface of the corresponding second fixing cylinder 23. Then the fastening collar 33 is pushed into the annular groove 3120 along a bottom to top direction of the screwing post 31, as indicated in FIG. 5. Typically, the fastening collar 33 snaps into engagement in the annular groove 3120. Next, the downward pressure is released, and the screwing post 31 moves upwardly until the fastening collar 33 abuts against a bottom of the first fixing cylinder 123. In this position, the elastic member 32 is compressed between the corresponding first fixing cylinder 123 of the fan 20 and the corresponding second fixing cylinder 23 of the heat sink 10. Thereby, the fan 20 and the heat sink 10 are secured together due to resilient force applied by the four compressed elastic members 32. Additionally, each fastening collar 33 prevents the fastener 30 from escaping from the heat sink 10 and the fan 20 when the heat dissipation device is subjected to vibration or shock.

Referring to FIG. 6 also, in assembling the heat dissipation device onto the electronic component mounted on the printed circuit board 100, a downward pressure is exerted on each fastener 30, to make the threaded pole 313 extend towards the printed circuit board 100. Then the screwing post 31 is rotated with respect to a corresponding threaded hole (not shown) of the printed circuit board 100 to make the threaded pole 313 of the fastener 30 threadedly engage with the printed circuit board 100. As a result, the elastic member 32 is further compressed between the corresponding first fixing cylinder 123 of the fan 20 and the corresponding second fixing cylinder 23 of the heat sink 10. Thereby, the fan 20 and the heat sink 10 of the heat dissipation device are fixed to and in tight contact with the electronic component mounted on the printed circuit board 100.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
   a fan comprising a plurality of first fixing cylinders;
   a heat sink comprising a plurality of second fixing cylinders; and
   a plurality of fasteners fixing the fan to the heat sink, each of the fasteners comprising a screwing post, an elastic member encircling the screwing post, and a fastening collar engaged with the screwing post;
   wherein each of the fasteners extends through a corresponding first fixing cylinder of the fan and a corresponding second fixing cylinder of the heat sink, the elastic member is compressed between the corresponding first fixing cylinder and the corresponding second fixing cylinder, and the fastening collar is located at a side of the second fixing cylinder opposite to the side of the second fixing cylinder where the elastic member is located.

2. The heat dissipation device of claim 1, wherein the fastening collar prevents the fastener from escaping from the heat sink and the fan.

3. The heat dissipation device of claim 1, wherein the screwing post comprises a head, a shaft extending coaxially downwardly from the head, and a threaded pole extending coaxially downwardly from the shaft.

4. The heat dissipation device of claim 3, wherein the shaft extends through the corresponding first fixing cylinder and the corresponding second fixing cylinder.

5. The heat dissipation device of claim 3, wherein the corresponding first fixing cylinder and the corresponding second fixing cylinder are sandwiched between the head of the screwing post and the fastening collar.

6. The heat dissipation device of claim 3, wherein the shaft defines an annular groove along a circumference thereof, and the fastening collar is received in the annular groove.

7. The heat dissipation device of claim 3, wherein when the head of the screwing post is pressed, the elastic member between the corresponding first fixing cylinder and the corresponding second fixing cylinder is further compressed, and the threaded pole is capable of being screwed into a printed circuit board.

8. The heat dissipation device of claim 3, wherein a diameter of the shaft is smaller than that of the head, and larger than that of the threaded pole.

9. The heat dissipation device of claim 1, wherein the heat sink comprises a base, a supporting board engaged with the base, a fin set disposed on the supporting board, and a plurality of heat pipes thermally connecting the base, the supporting board and the fin set.

10. The heat dissipation device of claim 9, wherein each of the heat pipes comprises an evaporation section, a condensation section, and a connecting section interconnecting the evaporation section and the condensation section.

11. The heat dissipation device of claim 10, wherein the evaporation section of each of the heat pipes is sandwiched between the base and the supporting board.

12. The heat dissipation device of claim 11, wherein the condensation section of each of the heat pipes extends through the fin set.

13. The heat dissipation device of claim 9, wherein the supporting board of the heat sink comprises a main body and a fin set holder connected to the main body, the fin set being mounted on the fin set holder and defining a plurality of air passages, and the fan being positioned such that an airflow path of airflow generated by the fan is in fluid communication with the air passages of the fin set.

14. The heat dissipation device of claim 13, wherein the fan has an airflow outlet located adjacent to the fin set.

15. The heat dissipation device of claim 13, wherein the supporting board comprises a plurality of mounting feet extending radially and outwardly from corners of the main body, and the second fixing cylinders extend outwardly from the mounting feet respectively.

16. The heat dissipation device of claim 15, wherein the fin set holder is connected to two corresponding mounting feet via two corresponding second fixing cylinders.

17. The heat dissipation device of claim 9, wherein the fan comprises a housing located over the supporting board, and an impeller rotatably disposed in the housing.

18. The heat dissipation device of claim 17, wherein the first fixing cylinders are formed on the housing of the fan.

19. The heat dissipation device of claim 1, wherein the elastic member is a coil spring.

20. A heat dissipation device comprising:
a fan comprising a plurality of first fixing cylinders;
a heat sink comprising a plurality of second fixing cylinders; and
a plurality of fasteners fixing the fan to the heat sink, each of the fasteners comprising a head, a screwing post, a helical spring encircling the screwing post, and a fastening collar snappingly engaged with the screwing post;
wherein each first fixing cylinder of the fan together with a corresponding second fixing cylinder of the heat sink are sandwiched between the head of the corresponding fastener and the fastening collar of the corresponding fastener, with the elastic member compressed between the corresponding first fixing cylinder and the corresponding second fixing cylinder, and a bottom of the screwing post of the corresponding fastener protrudes beyond the fastening collar for threaded engagement with a circuit board.

* * * * *